(12) United States Patent
Nichols et al.

(10) Patent No.: US 11,894,220 B2
(45) Date of Patent: Feb. 6, 2024

(54) METHOD AND APPARATUS FOR CONTROLLING A PROCESSING REACTOR

(71) Applicant: APPLIED MATERIALS, INC., Santa Clara, CA (US)

(72) Inventors: Michael Nichols, Sunnyvale, CA (US); Tina Dhekial-Phukan, Milpitas, CA (US); Venkata Ravishankar Kasibhotla, Bengaluru (IN); Ajit Balakrishna, Santa Clara, CA (US); Sanggyum Kim, Sunnyvale, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 1075 days.

(21) Appl. No.: 16/591,139

(22) Filed: Oct. 2, 2019

(65) Prior Publication Data

US 2021/0020410 A1     Jan. 21, 2021

Related U.S. Application Data

(60) Provisional application No. 62/875,042, filed on Jul. 17, 2019.

(51) Int. Cl.
*H01J 37/32* (2006.01)
*H01L 21/67* (2006.01)

(52) U.S. Cl.
CPC .... *H01J 37/3299* (2013.01); *H01J 37/32183* (2013.01); *H01J 37/32449* (2013.01); *H01J 37/32816* (2013.01); *H01J 37/32926* (2013.01); *H01L 21/67248* (2013.01); *H01L 21/67253* (2013.01); *H01J 2237/3321* (2013.01); *H01J 2237/3341* (2013.01)

(58) Field of Classification Search
CPC .......... H01J 37/32183; H01J 37/32449; H01J 37/32926; H01J 37/3299; H01J 37/32816; H01J 2237/3321; H01J 2237/3341; H01L 21/67253; H01L 21/67248
See application file for complete search history.

(56) References Cited

U.S. PATENT DOCUMENTS

| 4,957,605 A | 9/1990 | Hurwitt et al. |
|---|---|---|
| 5,665,214 A | 9/1997 | Iturralde |

(Continued)

*Primary Examiner* — Yuechuan Yu
(74) *Attorney, Agent, or Firm* — MOSER TABOA

(57) ABSTRACT

Methods and systems for processing substrates are provided. The system can include: a processing chamber configured to process a substrate based on a recipe; a plurality of sub-systems in operable communication with the processing chamber for controlling corresponding parameters associated with processing the substrate; and a controller in operable communication with the processing chamber and each of the plurality of sub-systems and configured to control each of the plurality of sub-systems and the processing chamber using information included in the recipe and feedback provided by at least one of the plurality of sub-systems. The controller is configured to compare information included in the recipe and feedback provided by at least one of the plurality of sub-systems with stored empirical information relating to the recipe and each of the plurality of sub-systems, and adjust at least one of the corresponding parameters associated with processing the substrate based on a determined comparison.

6 Claims, 3 Drawing Sheets

(56) References Cited

U.S. PATENT DOCUMENTS

| | | | |
|---|---|---|---|
| 5,871,805 A | | 2/1999 | Lemelson |
| 6,728,567 B2 | | 4/2004 | Goldman et al. |
| 6,913,938 B2 | | 7/2005 | Shanmugasundram et al. |
| 7,201,936 B2 | | 4/2007 | Schwarm et al. |
| 2002/0014483 A1 | * | 2/2002 | Suzuki .............. H01L 21/67248 |
| | | | 219/486 |
| 2003/0017256 A1 | | 1/2003 | Shimane |
| 2004/0044419 A1 | | 3/2004 | Saki et al. |
| 2007/0224840 A1 | | 9/2007 | Renau et al. |
| 2009/0239313 A1 | | 9/2009 | Anemikos et al. |
| 2014/0349492 A1 | * | 11/2014 | Shimamoto ....... C23C 16/45534 |
| | | | 438/786 |
| 2017/0107610 A1 | * | 4/2017 | Na ......................... C23C 14/54 |

\* cited by examiner

METHOD AND APPARATUS FOR CONTROLLING A PROCESSING REACTOR

CROSS-REFERENCE OF RELATED APPLICATIONS

The present application claims the benefit of and priority to U.S. Provisional Patent Application Ser. No. 62/875,042, filed on Jul. 17, 2019, the entire contents of which is incorporated herein by reference.

FIELD

Embodiments of the present disclosure generally relate to substrate processing chambers and control systems therefor.

BACKGROUND

Conventional control systems for substrate processing chambers, for example, as used in semiconductor substrate processing and thin film fabrication, can be configured to send one or more control signals to a processing chamber to control one or more one parameters (e.g., parameters associated with power, temperature, pressure, etc., which collectively are sometimes referred to as a recipe) that are used for processing a substrate. The one or more parameters can be independently controlled or monitored by one or more sub-systems that are in operable communication with the processing chamber. Additionally, recipe execution takes place sequentially from one step of the recipe to another step of the recipe, e.g., change setpoint of a first gas used for substrate processing and then change setpoint of a first generator used to create a plasma using the first gas.

Each of the subsystems have their own independent control systems. For example, processing chamber pressure is controlled by the pressure subsystem, but the pressure subsystem has no input or knowledge of changes in the other subsystems, e.g., temperature is controlled by a temperature subsystem using a proportional-integral-derivative (PID) algorithm. Accordingly, to address a sudden change in the pressure, a user would have to tweak or change the portion of the recipe relating to temperature by creating one or more transition steps. Such a process, however, may create an undesirable overlap between two steps of a recipe due to an unsynchronized transition from a first step to a second step. For example, since gas flow, pressure stabilization, and radio frequency (RF) generator setpoint changes all have different time constants, the different time constants can result in a wrong combination of power, pressure, and/or gas.

In addition, since the sub-systems can each have their own unique response time, a time delay associated with transmitting one or more control signals between the sub-systems is increased and can lead to damage to the processing chamber. For example, a power change from 10 W to 1000 W can occur relatively quickly, while a pressure change from 500 mT to 20 mT can occur relatively slowly. Such time delay can lead to damage, e.g., from a high voltage swing, to the processing chamber, sub-systems, and/or the components associated therewith, as a result of the time delay associated with receiving a control signal from the sub-system controlling the power change and transmitting a control signal to the sub-system controlling the needed pressure change.

SUMMARY

Methods and apparatus for processing a substrate are provided herein. In some embodiments, a system for processing a substrate can include a processing chamber configured to process a substrate based on a recipe; a plurality of sub-systems in operable communication with the processing chamber for controlling a corresponding parameter associated with processing the substrate; and a controller in operable communication with the processing chamber and each of the plurality of sub-systems and configured to control each of the plurality of sub-systems and the processing chamber using information included in the recipe and feedback provided by at least one of the plurality of sub-systems, wherein the controller is configured to compare the information included in the recipe and the feedback provided by the at least one of the plurality of sub-systems with stored empirical information relating to the recipe and each of the plurality of sub-systems, and adjust at least one of the corresponding parameters associated with processing the substrate based on a determined comparison.

In accordance with some embodiments, there is provided a method for processing a substrate. The method includes loading the substrate into a processing chamber in operable communication with a plurality of sub-systems for controlling a corresponding parameter associated with processing the substrate; processing, based on a recipe, the substrate under control of a controller in operable communication with the processing chamber and each of the plurality of sub-systems using information included in the recipe and feedback provided by at least one of the plurality of sub-systems; and comparing the information included in the recipe and the feedback provided by the at least one of the plurality of sub-systems with stored empirical information relating to the recipe and each of the plurality of sub-systems, and adjusting at least one of the corresponding parameters based on a determined comparison.

In accordance with some embodiments, there is provided a non-transitory computer readable storage medium having stored thereon a plurality of instructions that when executed by a controller perform a method for processing a substrate. The method includes loading the substrate into a processing chamber in operable communication with a plurality of sub-systems for controlling a corresponding parameter associated with processing the substrate; processing, based on a recipe, the substrate under control of a controller in operable communication with the processing chamber and each of the plurality of sub-systems using information included in the recipe and feedback provided by at least one of the plurality of sub-systems; and comparing the information included in the recipe and the feedback provided by the at least one of the plurality of sub-systems with stored empirical information relating to the recipe and each of the plurality of sub-systems, and adjusting at least one of the corresponding parameters based on a determined comparison.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
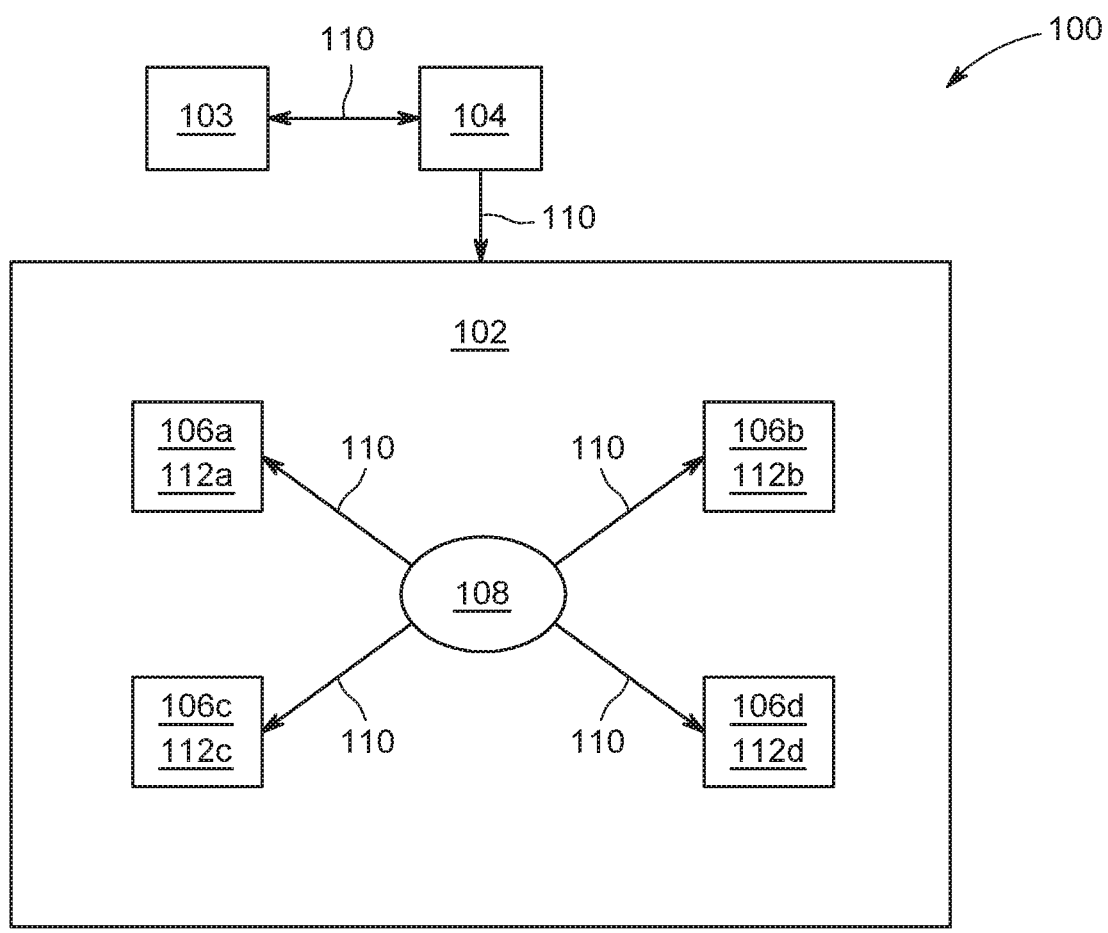
FIG. 1 is a diagram of a system including a controller in operable communication with a processing chamber including one or more sub-systems in accordance with at least some embodiments of the disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a methods and apparatus for processing a substrate are provided herein. Some advantages of the methods and apparatus described herein can include, but are not limited to one or more of: providing faster and repeatable mass flow controller (MFC) response and pressure command response; providing radio frequency (RF) commands with less variability in bias-only time during plasma strike; providing improved dynamic response to gas type and flowrate; providing mitigation of non-linear behavior for implementation of gain scheduling and real time learning; and providing feedback from sub-systems used for processing the substrate.

FIG. 1 is a diagram of a system 100 including a controller 104 in operable communication with a processing chamber 102 including one or more sub-systems 106a-106d in accordance with at least some embodiments of the disclosure.

The processing chamber 102 can be any type of processing chamber including, for example, a physical vapor deposition chamber (PVD) configured to perform a PVD process, an electrochemical deposition (ECD) chamber configured to perform an ECD process, a chemical vapor deposition chamber (CVD) configured to perform a CVD process, an atomic layer deposition chamber (ALD) configured to perform an ALD process, a chemical mechanical polishing (CMP) chamber configured to perform a CMP process, and an etching chamber configured to perform one or more etching processes (e.g., anisotropic, isotropic, wet/dry etch, etc.), all of which can be configured to perform a corresponding process on a substrate (not shown). The processing chamber 102 can be a stand-alone apparatus, or in some embodiments the processing chamber 102 can be on a component of a cluster tool (not shown), in which case the cluster tool can include a plurality of processing chambers 102.

The processing chamber 102 is in operable communication with the controller 104 via, for example, an ethernet for control automation technology (ECAT) interface 110 (shown schematically for illustrative purposes). The controller 104 is configured to control the overall operation of the processing chamber 102 (or processing chambers 102). For example, if the processing chamber 102 were a PVD chamber, the controller 104 can be in operable communication with one or more sub-systems of the processing chamber 102 using the ECAT interface 110 for controlling one or more corresponding parameters associated with a PVD process, while the PVD process is being performed on a substrate. For example, in some embodiments a power sub-system 106a can be configured to control a power (e.g., to change power used from 10 watts to 1000 watts) used during the PVD process, a temperature sub-system 106b can be configured to control a temperature used during the PVD process, a pressure sub-system 106c can be configured to control a pressure (e.g., to change a pressure from 500 mT to 20 mT) used during the PVD process, a gas delivery sub-system 106d can be configured to provide one or more suitable gases into the processing chamber 102, and a pedestal control sub-system can be configured to control a height of a substrate support of the pedestal relative to a sputter target. In some embodiments, a voltage control sub-system, a current control sub-system, and/or a de-gas control sub-system, can also be provided to control a voltage, current, and de-gas process, respectively.

In addition, one or more sensors 108 (one sensor 108 is shown in the figures) are operably disposed within an inner volume of the processing chamber 102 (e.g., on a sidewall or floor defined within the inner volume of the processing chamber 102 adjacent a substrate) and are configured to detect and provide one or more measurements/readings of one or more corresponding parameters associated with each of the sub-systems 106a-106d to the controller 104. While one sensor 108 is described herein, more than one sensor can be used, e.g., each of the sub-systems can use a corresponding sensor 108. In some embodiments, the sensor 108 can detect power provided by the power sub-system 106a (e.g., a power used to provide a biasing voltage or used to ignite a process gas used to create a plasma within the inner volume of the processing chamber 102, etc.); detect a temperature within the processing chamber 102, a temperature of one or more components within the processing chamber 102 (e.g., pedestal, process kit, or other component within the processing chamber 102), etc.; detect a pressure within the inner volume of the processing chamber 102 (during a PVD process); and detect one or more gases within the inner volume of the processing chamber 102, a state (e.g., plasma) of the one or more gases within the inner volume of the processing chamber 102, an amount of the one more gases within the inner volume of the processing chamber 102, a flow rate of the one or more gases into and out of the processing chamber 102, e.g., through an MFC of the gas delivery sub-system 106d, as will be described in greater detail below, etc.

Figure 2:
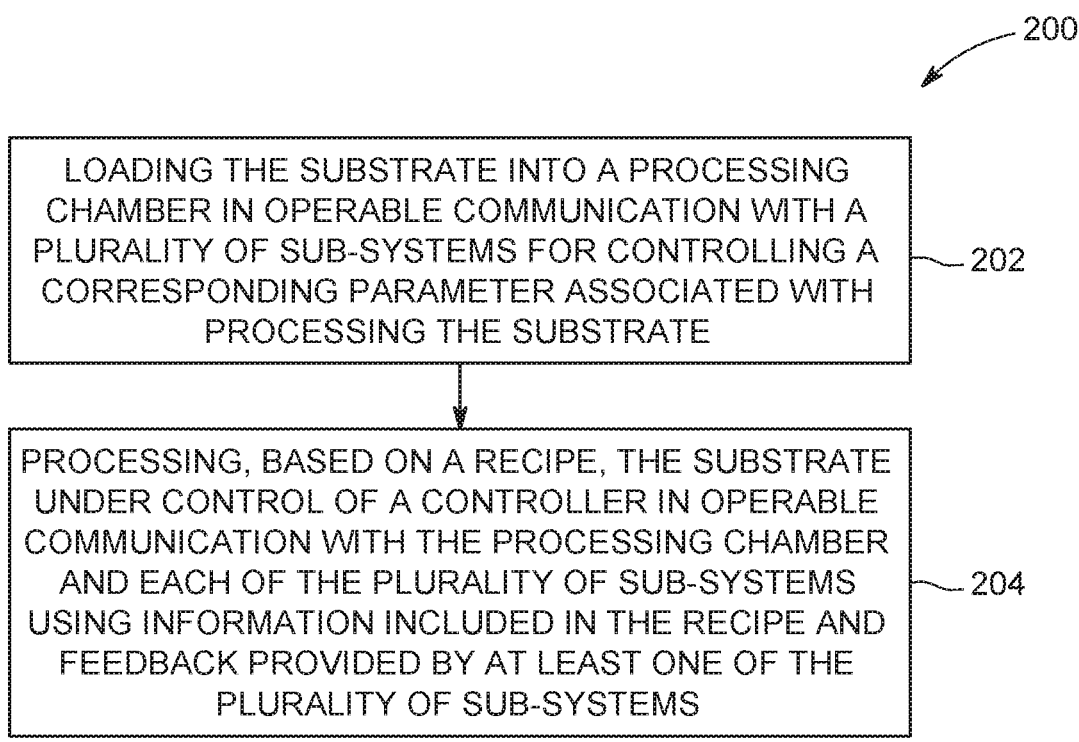
FIG. 2 is a flowchart of a method for processing a substrate in accordance with at least some embodiments of the disclosure.

The controller 104 includes or is in operable communication with a memory 103 (e.g., a non-transitory computer readable storage medium) having stored thereon a plurality of instructions that when executed by the controller 104 can perform a method 200 of FIG. 2 for processing a substrate. More particularly, at 202 a substrate is loaded into the processing chamber 102.

Next, at 204 the substrate is processed under the control of the controller 104, based on a recipe, which can be inputted to the controller 104 and then transmitted to each of the subsystems 106a-106d. The recipe, for example, includes a set or sets of instructions that are configured for operating the individual sub-systems 106a-106d. In some embodiments, the recipe can include information relating to a beginning or ending of a processing sequence including one or more setpoints (e.g., gas phase, which can include providing a mixture of one or more gases used, for example, during a PVD process or one or more of the above-described processes). For example, for a given recipe, instructions for a processing sequence for processing a substrate can begin at a first setpoint and can include instructions relating to one or more parameters used during the first processing sequence. The instructions for the first processing sequence can include, for example, which of one or more gases are to be used for a PVD process, a source generator(s) to be used for creating a biasing voltage (e.g., RF, direct current (DC), etc.) and creating a plasma within the processing chamber 102, an ignition method (e.g., using RF, DC, etc.) for igniting a process gas used to create plasma, pressure/temperature used during the PVD process, time interval for a given processing sequence, etc.

During processing of the substrate, each of the sub-systems 106a-106d is configured to control a corresponding parameter in accordance with the recipe using a respective one of the control systems 112a-112d. Feedback information relating to the above-described parameters associated with a corresponding one of the sub-systems 106a-106d is provided to the controller 104 using the sensor 108, e.g., over the common ECAT interface 110, and to a respective one of the control systems 112a-112d of the sub-systems 106a-106d. If the controller 104 detects that one or more of the parameters has deviated from a predetermined or calculated threshold, the controller 104 is configured to adjust the one or more parameters to correct the deviation.

For example, the inventors have found that the controller 104 can use a control algorithm stored in the memory 103 that can be based on a model/equation and that describes how a system or sub-system (e.g., the sub-systems 106a-106d) behave(s) in terms of inputs vs outputs. For example, when a wafer is processed in the processing chamber 102, the controller 104 uses the feedback information and the control algorithm to adjust one or more of the control systems 112a-112d to achieve a desired behavior corresponding to the recipe that is being run. A recipe may have many steps or operations, and at each transition from one step to the next there may be several control variables changing (e.g., gas type, flow rate, pressure, RF power setpoints, etc.). The sensor 108 provides the feedback relating to the effects of the changes to a respective one of the control system 112a-112d of the sub-systems 106a-106d, and the feedback information collected is then transmitted from the sub-systems 106a-106d to the controller 104. The controller 104 analyzes the feedback information and transmits a control signal back to the one or more of the control systems 112a-112d for adjusting one or more control variables to get the desired result.

For example, in at least some embodiments, a control algorithm can be configured to determine how pressure in the processing chamber 102 will behave, for example, with respect to light atomic weight gases vs heavy atomic weight gases. In such embodiments, the controller 104 can analyze the feedback information provided by one or more of the control systems 112a-112d (e.g., the control system 112c of the pressure sub-system 106c), which is received from the sensor 108, using the control algorithm, and can adjust or control one or more of the other sub-systems 106a, 106b, and/or 106d based on the feedback information and the control algorithm.

For example, in at least some embodiments, the controller 104 may send a control signal to the control system 112a for adjusting/changing the RF power setpoint at a step transition. More particularly, the RF sensor information obtained from the sensor 108 can be fed to the control algorithm which can calculate the power change using the model/equation and stored empirical information, which can be previously obtained and stored in the memory 103, e.g., by comparing the feedback information received from the control systems 112a-112d with the stored empirical information. The model/equation and/or empirical information can include, for example, data relating to one or more previously performed processes that include a step transition (e.g., data relating to a temperature, pressure, or gas at the step transition) having the same RF power set point. The control algorithm then uses the calculated power change to determine which, if any, of the subs-systems, e.g., the pressure sub-system 106c, will be affected by the power change. For example, the power change can cause a pressure overshoot in the processing chamber 102 during the step transition. The controller 104 can then send a control signal to the control system 112c of the pressure sub-system 106c to adjust the pressure, e.g., decrease a pressure within the processing chamber 102, to compensate for the RF power change at the step transition, thus advantageously preventing the pressure overshoot.

Figure 3:
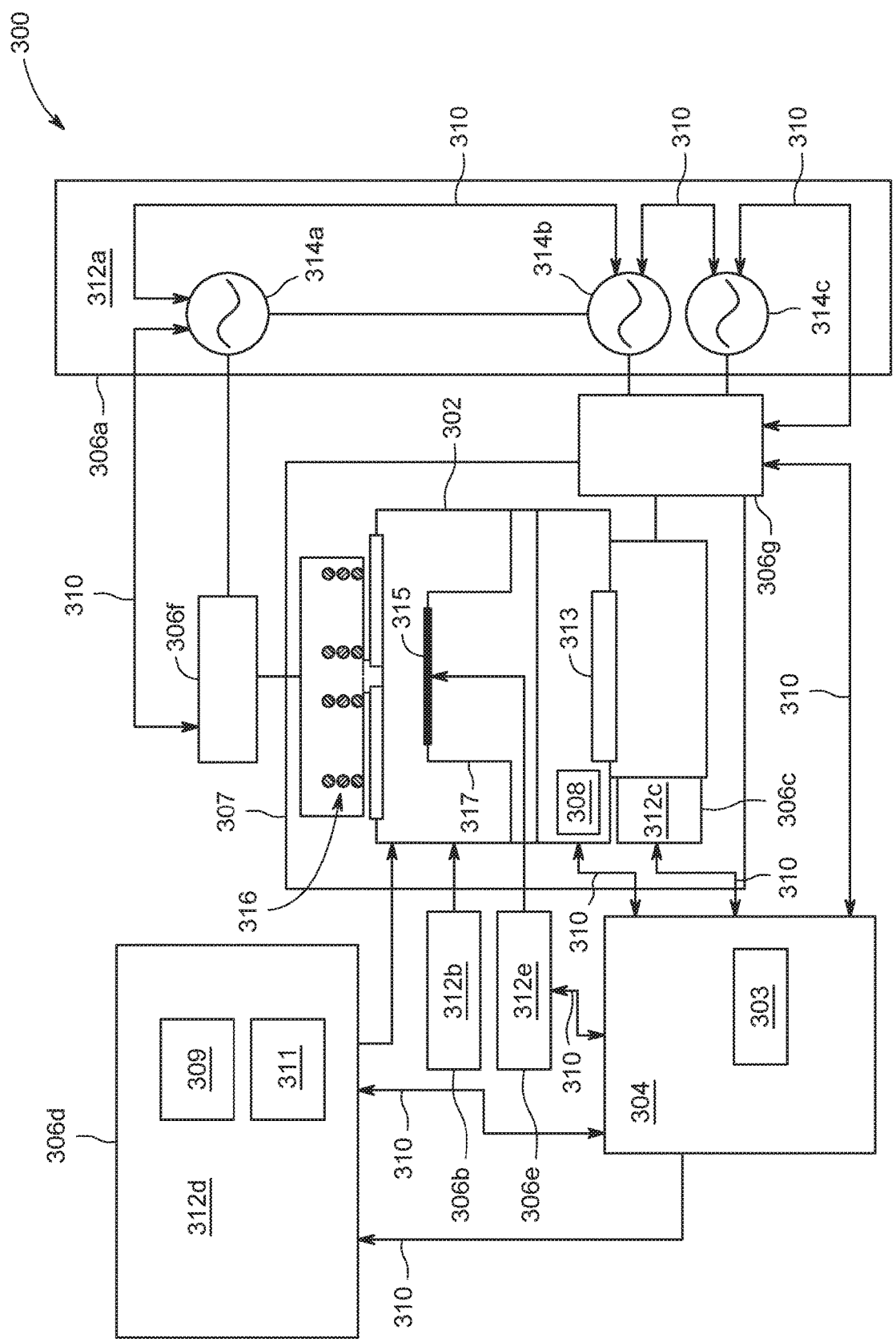
FIG. 3 is a schematic diagram of a system in accordance with at least some embodiments of the disclosure.

FIG. 3 is a schematic diagram of a system 300 in accordance with at least some embodiments of the disclosure. The system 300 is configured to perform one or more of the above described processes. For example, in some embodiments, the system 300 can be configured to perform an etch process. Accordingly, the system 300 includes a processing chamber 302, a power sub-system 306a, a temperature sub-system 306b, a pressure sub-system 306c, a gas delivery sub-system 306d, a backside sub-system 306e, an impedance matching sub-system 306f, and a bias matching sub-system 306g. A controller 304 is configured to receive a recipe for processing one or more substrates or wafers and includes a memory 303. The controller 304 controls the overall operation of the processing chamber 302 based on the input recipe during operation.

The power sub-system 306a, which can function like the power sub-system 106a, can include one or more RF power sources that are configured to supply power to the processing chamber 302. For example, the sub-system 306a can include an RF power source 314a (e.g., RF plasma power supply) that delivers RF power to the processing chamber 302 for creating a processing plasma. Additionally, one or more RF power sources can be provided for providing a biasing potential to the processing chamber 302. For example, in some embodiments, two RF power sources 314b and 314c can be provided for providing a biasing potential to the processing chamber 302. For example, in some embodiments, the RF power source 314a and RF power sources 314b and 314c are coupled to an electrostatic chuck 317 via respective RF match networks (e.g., source load). More particularly, the RF power source 314a is coupled to the impedance matching sub-system 306f, which includes the RF match networks that is coupled to the processing chamber 302 and configured to match an RF impedance of a source load 307 at the processing chamber 302 to provide maximum power delivery. For example, the source load 307 can include one or more resistors, inductors, capacitors or combination thereof. For illustrative purposes, the source load 307 is shown including four inductive coils 316 that are operatively coupled to the processing chamber 302. The impedance matching sub-system 306f is configured to adjust a current through the inductive coils 316 for changing an inductance of the inductive coils 316 and, thus, an overall impedance of the source load 307.

Similarly, the bias matching sub-system 306g is configured to provide bias matching to one or more electrodes (not shown) within the electrostatic chuck 317 to attract ions from a plasma towards a substrate 315 that is supported on the electrostatic chuck 317.

A control system 312a of the power sub-system 306a controls both the RF power sources 314a-314c, the impedance matching sub-system 306f, and the bias matching sub-system 306g during operation. The control system 312a communicates with a sensor 308, which is configured like the sensor 108, for providing feedback over an ECAT interface 310, as described in greater detail below.

The temperature sub-system 306b, the pressure sub-system 306c, and the gas delivery sub-system 306d function like the temperature sub-system 106b, the pressure sub-system 106c, and the gas delivery sub-system 106d, respectively.

For example, the pressure sub-system 306c includes a pump controller and valve controller 313 that are configured to receive pressure and throttle valve position setpoints from a control system 312c. For the example, the control system 312c can control the pump controller and valve controller 313 to adjust a throttle valve to adjust process pressure inside the processing chamber 302, and to provide feedback over the ECAT interface 310, as described in greater detail below.

Likewise, the backside sub-system 306e receives a pressure setpoint, e.g., included in the input recipe, from the controller 304 for controlling a pressure of one or more suitable backside gases, e.g., helium, argon, etc., to a backside of the substrate 315 for ensuring thermal contact between the substrate 315 and the electrostatic chuck. A control system 312e communicates with the sensor 308 and provides feedback over the ECAT interface 310, as described in greater detail below.

The gas delivery sub-system 306d can include one or more mass flow controller(s) (MFCs) 309 that are configured to receive a flow setpoint, e.g., included in the input recipe, from the controller 304 for controlling gas flow of one or more process gases to the processing chamber 302. Similarly, the gas delivery sub-system 306d can include one or more flow ratio controller(s) (FRCs) 311 that are configured to receive a flow ratio setpoint e.g., flow split setpoint included in the input recipe, from the controller 304 for controlling a ratio of incoming process gas to one or more output zones. The gas delivery sub-system 306d includes a control system 312d that communicates with the sensor 308 and provides feedback over the ECAT interface 310, as described in greater detail below.

The sensor 308 is operably disposed within the processing chamber 302 and is configured to provide feedback information relating to the above-described parameters associated with a corresponding one of the sub-systems, e.g., over the ECAT interface 310. More particularly, the sensor 308 provides the feedback relating to the effects of the changes to a corresponding sub-system 306a-306g, and the feedback information collected is then transmitted from the sub-systems to the controller 304, which, in turn, using the control algorithm analyzes the feedback information and transmits a control signal back to the one or more of the control systems 312a-312e for adjusting one or more control variables to get the desired result.

For example, as described above, the sensor 308 can provide feedback to the control system 312a for adjusting/changing the RF power setpoint at a step transition. The RF sensor information can be fed to the control algorithm which can calculate the power change using the model/equation and empirical information, which can be previously obtained and stored in the memory 303. The model/equation and/or empirical information can include, for example, data relating to one or more previously performed processes that include a step transition having the same RF power set point. The control algorithm uses the calculated power change to determine which, if any, of the subs-systems, e.g., the pressure sub-system 306c, will be affected by the power change.

For example, as noted above, the power change can cause a pressure overshoot in the processing chamber 302 during the step transition. The controller 304 can then send a control signal to the control system 312c of the pressure sub-system 306c to adjust the pressure, e.g., decrease a pressure within the processing chamber 102, to compensate for the RF power change at the step transition, thus advantageously preventing the pressure overshoot. For example, in some embodiments, the control system 312c can be configured to control the pump controller and valve controller 313 to adjust a throttle valve to adjust process pressure inside the processing chamber 302. Alternatively or additionally, the power change can cause other pressure changes in the processing chamber 302. For example, the pressure of one or more backside gases to the substrate 315 can be affected. Accordingly, the control system 312e can adjust (e.g., increase/decrease) a pressure of the backside gas being provided to the backside of the substrate 315.

Alternatively or additionally, as a result of the power change, the controller 304 may determine that an amount or ratio of process gas may also need to be changed/adjusted. Accordingly, the controller 304 may send a control signal to the control system 312d of the gas delivery sub-system 306d to control a flow of gas and/or a ratio of gas into the processing chamber 302 using, for example, the MFCs 309 and/or the FRCs 311, respectively.

Alternatively or additionally, as a result of the power change the controller 304 may determine that impedance at the source load 307 or bias at the electrostatic chuck 317 of processing chamber 302 may also need to be changed/adjusted. Accordingly, the controller 304 may send a control signal to the control system 312a for impedance and/or bias matching at the source load 307 and/or the electrostatic chuck 317, respectively.

Alternatively or additionally, as a result of the power change the controller 304 may determine that a temperature within the processing chamber 302 needs to be changed, (e.g., the electrostatic chuck 317, process kit, etc.) Accordingly, the controller 304 may send a control signal to a control system 312b which, in turn, can be configured to adjust a temperature of, for example, the electrostatic chuck 317, using for example, a DC source, one or more of the RF power sources 314a-314c, or other suitable device.

While the foregoing is directed to embodiments of the present disclosure, other and further embodiments of the disclosure may be devised without departing from the basic scope thereof.

What is claimed is:

1. A system for processing a substrate, comprising:
   a processing chamber configured to process a substrate based on a recipe;
   a plurality of sub-systems in operable communication with the processing chamber for controlling a plurality of different parameters associated with processing the substrate; and
   a controller in operable communication, via a common ethernet for control automation technology (ECAT) interface, with the processing chamber and each of the plurality of sub-systems and configured to control each of the plurality of sub-systems and the processing chamber using information included in the recipe and feedback provided by each of the plurality of sub-systems,
   wherein the controller is configured to compare the information included in the recipe and the feedback provided by each of the plurality of sub-systems with stored empirical information relating to the recipe and each of the plurality of sub-systems, and adjust at least one parameter of the plurality of different parameters associated with processing the substrate based on a determined comparison, wherein the stored empirical information comprises an RF power setpoint at a step transition, and wherein, during processing of the substrate, when the controller detects a change in RF power at the step transition, the controller adjusts a pressure, which has the same step transition as the RF power setpoint step transition, to compensate for the change in RF power at the step transition and prevent pressure overshoot in the processing chamber.

2. The system of claim 1, wherein the processing chamber is configured to perform at least one of a physical vapor deposition process, an electrochemical deposition process, a chemical vapor deposition process, an atomic layer deposition process, a chemical mechanical polishing process, and an etching process.

3. The system of claim 1, wherein the plurality of sub-systems includes at least one of a power sub-system, a temperature sub-system, a pressure sub-system, a gas delivery sub-system, a backside sub-system, an impedance matching sub-system, and a bias matching sub-system.

4. The system of claim 1, wherein the processing chamber comprises a plurality of processing chambers.

5. The system of claim 1, wherein the recipe includes instructions for a processing sequence including which of one or more gases are to be used for processing the substrate, a source generator to be used for creating a biasing voltage and creating a plasma within the processing chamber, an ignition method for igniting process gas used to create the plasma, at least one of a pressure or temperature used for processing the substrate, and a time interval for the processing sequence.

6. The system of claim 1, further comprising one or more sensors disposed within the processing chamber, operably connected to the controller, configured to detect the plurality of different parameters associated with processing the substrate, and provide information relating to the plurality of different parameters to the controller during processing of the substrate.

* * * * *